United States Patent [19]
Yamada

[11] Patent Number: 6,047,393
[45] Date of Patent: Apr. 4, 2000

[54] MEMORY TESTING APPARATUS

[75] Inventor: Masuhiro Yamada, Ashikaga, Japan

[73] Assignee: Advantest Corporation, Tokyo, Japan

[21] Appl. No.: 09/094,533

[22] Filed: Jun. 12, 1998

[30] Foreign Application Priority Data

Jun. 13, 1997 [JP] Japan .................................. 9-156926
Jun. 18, 1997 [JP] Japan .................................. 9-161067

[51] Int. Cl.$^7$ .................................................. G11C 29/00
[52] U.S. Cl. ........................................ 714/718; 714/738
[58] Field of Search .................................. 714/718, 719,
714/721, 738, 742, 743, 744; 365/201;
324/158.1

[56] References Cited

U.S. PATENT DOCUMENTS

| | | | |
|---|---|---|---|
| 4,775,977 | 10/1988 | Hehara | 714/738 |
| 5,528,136 | 6/1996 | Rogoff et al. | 324/158.1 |
| 5,889,936 | 3/1999 | Chan | 714/39 |
| 5,909,448 | 6/1999 | Takahashi | 714/719 |
| 5,917,833 | 6/1999 | Sato | 714/718 |
| 5,978,949 | 11/1999 | Terayama | 714/738 |

Primary Examiner—Hoa T. Nguyen
Attorney, Agent, or Firm—Gallagher & Lathrop; David N. Lathrop

[57] ABSTRACT

There is provided a memory testing apparatus which can complete a DC test FOR a memory in a short time period. A pattern generator 2 comprises a hold time setting device 2A for setting a hold time during which a test signal of a predetermined pattern is kept being applied to a memory under test 4, a hold mode control device 2B, activated upon setting of a hold time, for controlling the pattern generator 2 in a hold mode, a DC test start command generating device 2C for generating a DC test start command DCS for starting a DC test of the memory, a pattern end detecting device 2D for detecting when the DC test for the memory is completed, and an end signal generating device 2E for generating a pattern end signal PGEND indicating the completion of the DC test, and there is provided a signal line 5 for transmitting the DC test start command DCS to a DC test unit 3, and further, the DC test unit 3 comprises a decision device 3A for comparing a voltage or a current taken out from the memory with a reference value and a failure analysis memory 3B for storing therein a failure address of the memory.

12 Claims, 5 Drawing Sheets

MEMORY TESTING APPARATUS

BACKGROUND OF THE INVENTION

1. Field of the Invention

The present invention relates to a memory testing apparatus suitable for testing a memory such as, for example, a flash memory.

2. Description of the Related Art

Heretofore, a direct current (DC) test has been performed for a memory in addition to a functional test therefor. The DC test means a test which checks, in the state that a predetermined voltage is being applied to a terminal of a memory under test (the memory is generally constructed in the form of a semiconductor integrated circuit (IC)), whether or not a predetermined current can be taken out from that terminal, or checks, in the state that a predetermined current is being taken out from a terminal of a memory under test, whether or not a voltage of that terminal can be maintained at a predetermined voltage, or the like. The former is called current measuring test under voltage applied to a memory under test and the latter is called voltage measuring test under current applied to a memory under test.

FIG. 5 is a block diagram showing a general construction of an example of the circuit configuration necessary for performing a DC test provided in a conventional semiconductor integrated circuit testing apparatus (IC testing apparatus), specifically, an IC memory testing apparatus. The illustrated IC memory testing apparatus (hereinafter referred to simply as a memory testing apparatus) includes a controller 1, a pattern generator 2, and a direct current (DC) test unit 3. The controller 1 is generally constructed by a computer system and controls the operations of a plurality of units in the memory testing apparatus through a control bus line BUS. In the illustrated example, units controlled by the controller 1 are only the pattern generator 2 and the DC test unit 3. However, it is needless to say that the other units not shown are also controlled by this controller 1.

The pattern generator 2 generates a test signal TS having a predetermined pattern to be applied to a memory under test, an address signal, a control signal and the like. In a DC test, the pattern generator 2 supplies a test signal TS having a predetermined pattern to a memory cell of a specified address of a memory under test (MUT) 4 and the DC test unit 3 measures a voltage or a current of a specified terminal of this memory under test 4, as shown by a line 10 with arrows at its opposite ends, to perform a DC test. This DC test is performed for each of the terminals of the memory under test 4.

The DC test is performed as follows.

(1) The DC test is started by supplying a pattern generation command PGS to the pattern generator 2 from the controller 1 via the control bus line BUS.

(2) The pattern generator 2 supplies an initialization pattern signal, upon receiving the pattern generation command PGS, to the memory under test 4 to initialize the state of the memory under test 4.

(3) After the initialization, the pattern generator 2 applies a test signal TS having a predetermined pattern to a memory cell of an address of the memory under test 4 specified by an address signal and enters a hold mode in which the pattern is inhibited from being updated. Then the pattern generator 2 sends to the controller 1 a pattern hold signal PGH indicating that the pattern generator 2 has entered the hold mode.

(4) The controller 1 supplies, upon receiving the pattern hold signal PGH, a DC test start command DCS to the DC test unit 3 to activate the DC test unit 3 thereby causing the unit to start the DC test.

(5) The DC test unit 3 measures a voltage or a current of a specified terminal of the memory under test 4 and sends the measurement result MEC to the controller 1.

(6) The controller 1 compares the measurement result (a voltage value or a current value) sent from the DC test unit 3 with a reference value to determine whether the memory cell is defective (failure) or not. If the measurement result departs or differs from the reference value, the memory cell at that address is determined to be a failure one and its address is stored in a memory. When the address of the failure memory cell is stored in the memory, the DC test of that address is completed.

(7) The controller 1 supplies a control command PGCON for proceeding to a next step to the pattern generator 2 to reset the hold mode of the pattern generator 2 and to update the address of the memory under test 4 to which a test signal is to be supplied and the pattern of the test signal. Then the controller 1 applies a test signal having the updated pattern to a memory cell at the updated address. Then the pattern generator 2 enters a hold mode again in which the pattern is inhibited from being updated.

(8) Thereafter, the above operations (4)–(7) are repeated for memory cells of all the addresses of the memory under test 4.

(9) When the DC test for one specified terminal is completed, the same DC test is performed for next one specified terminal.

In such a way, the DC tests are sequentially performed for all the terminals of the memory under test 4.

Incidentally, in case of a flash memory which is a flash electrically erasable programmable read only memory or another non-volatile memories (memories the stored contents of which are not erased even if the power supply is turned off), there is a case a next process to be performed may be selected depending on the result of the DC test.

As an example of this case, methods such as described below are employed. That is, when a measured voltage of a specified terminal is out of the reference range in, for example, H side (higher potential side), writing operations of a test pattern signal are repeated for a memory cell of an address to which the test pattern signal was applied. After the writing operations are repeated predetermined times or more, the test is performed again. Further, when a measured voltage is out of the reference range in L side (lower potential side), erasing operations of the test pattern signal already written in the memory cell of the address are repeated. When the number of erasing operation times reaches a predetermined value, a process that the test is performed again or the like is performed.

Therefore, the conventional memory testing apparatus is arranged such that a decision or determination function is provided in the controller 1 wherein a failure state as to whether the voltage or current measured by the DC test unit 3 is out of the reference range in H side or L side is determined by the controller 1 based on the measured value from the DC test unit 3, and then a control signal for the operation to be performed in next step is supplied to the pattern generator 2 in accordance with the failure state.

As mentioned above, in the conventional memory testing apparatus, the controller 1 intervenes in all the steps except step (2), i.e., steps (1), (3), (4), (5), (6), (7), (8) and (9). Since, particularly in the case where the memory under test 4 is a flash memory, the DC test is performed for each terminal of the memory under test 4 at all the addresses of thereof, the number of control operations of the controller 1 becomes huge and the time period required for the control becomes, if accumulated, also very long. In addition, in the case of a flash memory, since the conventional memory testing apparatus is arranged such that a condition for operating the pattern generator 2 in the next step is selected, as mentioned above, based on the decision operation of the controller 1 depending upon the state at the time a failure has occurred, the number of operation times of the controller 1 is increased more and more. As a result, there is a drawback in the conventional memory testing apparatus that the time period required for a DC test becomes considerably long. That is, there is a disadvantage that a DC test cannot be completed in a short time period.

SUMMARY OF THE INVENTION

It is an object of the present invention to provide a memory testing apparatus which is capable of completing a DC test for a memory in a short time period.

It is another object of the present invention to provide a memory testing apparatus which can complete a test for a memory such as a flash memory in a short time period.

In a first aspect of the present invention, in order to accomplish the above objects, there is provided a memory testing apparatus including a pattern generator for supplying a test signal having a predetermined pattern to a memory under test, a direct current test unit for measuring a voltage appearing at a terminal of the memory under test or a current flowing through the terminal of said memory under test, and a controller for controlling operations of those pattern generator and the direct current test unit, said pattern generator comprising: hold time setting means for setting a time duration of a hold mode in which said pattern generator is maintained in a state that a test signal of one pattern is kept being generated from said pattern generator; hold mode control means for controlling said pattern generator in the hold mode; and direct current test start command generating means for supplying a direct current test start command to said direct current test unit in a state that said hold mode control means has controlled said pattern generator in the hold mode, said direct current test unit comprising: decision means for determining whether or not a voltage value or a current value measured by said direct current test unit coincides with a reference value; and a failure analysis memory for storing therein a result of failure decision determined by said decision means representing that the measured voltage value or current value does not coincide with the reference value.

In a preferred embodiment, the pattern generator further includes pattern end detecting means for detecting an end of the direct current test for the memory under test; and end signal generating means for generating a pattern end signal indicating the end of the direct current test and for sending the pattern end signal to the controller when the pattern end detecting means detects the end of the direct current test; and the controller reads out, upon receiving the pattern end signal, the stored failure decision result from the failure analysis memory.

The decision means determines, if the voltage value or the current value measured by the direct current test unit is within a defined range, the measured value to be pass, and if the voltage value or the current value is out of the defined range, the measured value to be failure. The failure analysis memory stores a data indicating a failure in the same address of the failure analysis memory as that of the memory under test where the measured value determined to be failure by the decision means was generated.

With the construction of the present invention stated above, it is sufficient for the controller to supply only a pattern generation command to the pattern generator, and since the pattern generator and the direct current test unit perform a direct signal transfer between them without requiring the control operation by the controller, the time period when the controller intervenes can be eliminated and the time period required for a direct current test of each address can be reduced. That is, the time period between the issuance of the pattern generating command and the writing of the failure decision result in the failure analysis memory can be reduced. As a result, when the DC tests are performed for all the addresses for each of the terminals of the memory under test, the time period of the direct current tests becomes very short compared with that in the conventional memory testing apparatus.

In another preferred embodiment, the direct current test unit further includes test end detecting means for detecting an end of a direct current test performed for each of addresses of the memory under test; and direct current test end signal generating means for outputting a direct current test end signal indicating the end of the direct current test when the test end detecting means detects the end of the direct current test performed for each address; and the hold mode control means resets the hold mode of the pattern generator to enable an update of the pattern of the test signal when the pattern generator receives the direct current test end signal generated by the direct current test end signal generating means.

As a hold time value to be set in the hold time setting means, a value of time period longer than that required for a direct current test performed for each address is set with a margin. On the other hand, according to the construction of the above another embodiment, immediately after a direct current test performed for each address is completed, the hold mode is reset and the process proceeds to the next step. Therefore, a time period required for a direct current test for each address can be reduced.

In a second aspect of the present invention, there is provided a memory testing apparatus including a pattern generator for supplying a test signal having a predetermined pattern to a memory under test, a direct current test unit for measuring a voltage appearing at a terminal of said memory under test or a current flowing through the terminal of said memory under test, and a controller for controlling operations of those pattern generator and direct current test unit, the direct current test unit comprising: decision means for determining whether or not a voltage value or a current value measured by said direct current test unit coincides with at least one reference value; and means for transmitting to said pattern generator a result of failure decision determined by said decision means representing that the measured voltage value or current value does not coincide with the reference value, the pattern generator comprising: operation mode selecting means for selecting a next operation mode of the pattern generator depending upon the failure decision result transmitted from said direct current test unit thereby operating said pattern generator in the selected operation mode.

In a preferred embodiment, the decision means determines whether the voltage value or the current value measured by the direct current test unit is out of a defined range over upper side or out of the defined range below lower side. The decision means may be constructed such that the decision means compares the voltage value or the current value measured by the direct current test unit with two or more different reference values to output two or more failure decision results.

The failure analysis memory stores a data indicating a failure in the same address of the failure analysis memory as that of the memory under test where the decision result determined to be failure by the decision means was generated.

The pattern generator further comprises hold time setting means for setting a time duration of a hold mode in which the pattern generator is maintained in a state that a test signal of one pattern is kept being generated from the pattern generator; hold mode control means for controlling the pattern generator in the hold mode; and direct current test start command generating means for supplying a direct current test start command to the direct current test unit in a state that the hold mode control means has controlled the pattern generator in the hold mode.

In addition, the pattern generator further includes pattern end detecting means for detecting an end of the direct current test for the memory under test; and end signal generating means for generating a pattern end signal indicating the end of the direct current test and for sending the pattern end signal to the controller when the pattern end detecting means detects the end of the direct current test; and the controller reads out, upon receiving the pattern end signal, the stored failure decision result from the failure analysis memory.

With the construction of the present invention described above, it is sufficient for the controller to supply only a pattern generating command to the pattern generator, and since the pattern generator and the direct current test unit perform a direct signal transfer between them without requiring the control operation by the controller, the time period when the controller intervenes can be eliminated and the time period required for a direct current test of each address can be reduced. That is, the time period between the issuance of the pattern generation command and the time point when an operation mode of the next step of the pattern generator is selected and the pattern generator completes the selected operation mode can be reduced. As a result, when the direct current tests are performed for all the addresses for each of the terminals of the memory under test, the time period of the direct current tests becomes very short compared with that in the conventional memory testing apparatus.

According to another preferred embodiment, the direct current test unit further includes a failure analysis memory for storing therein a failure decision result determined by the decision means representing that the measured voltage value or current value does not coincide with the reference value; test end detecting means for detecting an end of a direct current test performed for each of addresses of the memory under test; and direct current test end signal generating means for outputting a direct current test end signal indicating the end of the direct current test when the test end detecting means detects the end of the direct current test performed for each address; and the hold mode control means resets the hold mode of the pattern generator to enable an update of the pattern of the test signal when the pattern generator receives the direct current test end signal generated by the direct current test end signal generating means.

As a hold time value to be set in the hold time setting means, a value of time period longer than that required for a direct current test performed for each address is set with a margin. On the other hand, according to the construction of the above another embodiment, immediately after a direct current test performed for each address is completed, the hold mode is reset and the process proceeds to the next step. Therefore, a time period required for a direct current test for each address can be reduced.

DETAILED DESCRIPTION OF THE PREFERRED EMBODIMENTS

Now several embodiments of the memory testing apparatus according to the present invention will be described in detail with reference to FIGS. 1 to 4.

Figure 1:
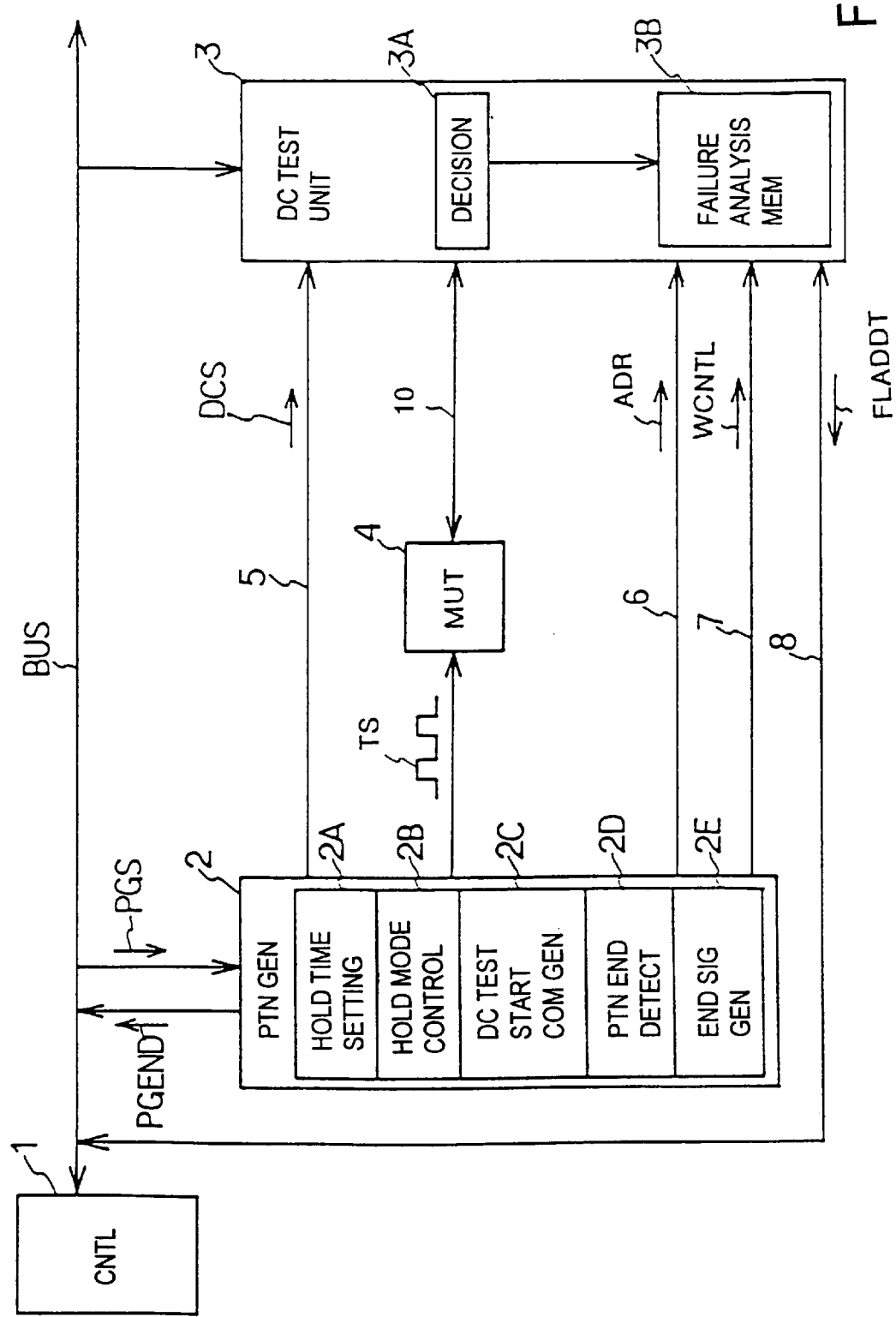
FIG. 1 is a block diagram showing the circuit configuration of a main portion of a first embodiment of the memory testing apparatus according to the present invention.

FIG. 1 is a block diagram showing the circuit configuration necessary for performing a DC test in the first embodiment of the memory testing apparatus according to the present invention. Further, portions or elements in FIGS. 1–4 corresponding to those in FIG. 5 have the same reference characters affixed thereto as those in FIG. 5 respectively and the explanation thereof will be omitted unless it is necessary.

In the first embodiment of the present invention, the memory testing apparatus is characterized in that a pattern generator 2 comprises a hold time setting device 2A for setting a hold time during which a test signal TS having a predetermined pattern to be applied to a memory under test (MUT) 4 is kept being applied to the memory under test (MUT) 4, a hold mode control device 2B which is activated upon setting of a hold time and controls the pattern generator 2 in a hold mode in which a pattern of the test signal TS is not updated, a DC test start command generating device 2C for generating a DC test start command DCS for starting a DC test for the memory under test 4, a pattern end detecting device 2D for detecting when the DC tests of the memory under test 4 are completed, and an end signal generating device 2E for generating a pattern end signal PGEND indicating the completion of the DC tests, that there is provided a signal line 5 for transmitting the DC test start command DCS to a DC test unit 3, and that the DC test unit 3 comprises a decision device 3A for comparing a voltage or a current taken out from the memory under test with a reference value and a failure analysis memory 3B for storing therein an address of a failure memory cell in the memory under test 4.

According to the memory testing apparatus constructed as described above, it is sufficient for the controller 1 to supply only a pattern generation command PGS to the pattern generator 2 at the starting time of the DC tests. The pattern generator 2 executes, upon receiving the pattern generation command PGS, an initialization pattern generating program to generate an initialization pattern. This initialization pattern is supplied to the memory under test 4 and the memory under test 4 is initialized.

In this embodiment, an operation for reading a hold time to be set in the hold time setting device 2A is added to the initialization pattern generating program. The hold time to be set in the hold time setting device 2A is stored in, for example, a portion for storing a set time provided in the above program. The setting of a hold time is completed by reading the stored set time into the hold time setting device 2A when the initialization pattern generating program is executed. When a hold time is set, the hold mode control device 2B is activated and then the pattern generator 2 is controlled in a hold mode.

When the pattern generator enters a hold mode, a test pattern signal TS being applied to the memory under test 4 in this hold mode is written in an address being accessed at that time and the test pattern written in the address is read out. At the same time, the DC test start command generating device 2C is activated and a DC test start command DCS is supplied to the DC test unit 3 via the signal line 5.

The DC test unit 3 switches, immediately upon receiving the DC test start command DCS, its mode to a DC test mode. In this DC test mode, the DC test unit 3 measures a voltage or a current of one output terminal of the memory under test 4 which is, for example, in the reading state.

The voltage value or the current value obtained by the measurement is sent to the decision device 3A provided in the DC test unit 3, where the measured voltage value or current value is compared with a reference value. If the measured value is within the set range of the reference value, the memory cell is determined to be defectless or pass, and if the measured value is out of the set range, the memory cell is determined to be defective or failure. When the memory cell is determined to be failure, the memory cell address of the memory under test 4 being accessed at that time is stored in the failure analysis memory 3B. The storing operation of an address of a failure memory cell is performed, for example, as follows.

The failure analysis memory 3B is constructed with a memory having the same memory space (area) as that of the memory under test 4. An address signal ADR which is the same as the address signal contained in a test pattern signal TS applied to the memory under test 4 from the pattern generator 2 is supplied to the failure analysis memory 3B from the pattern generator 2 via signal line 6 to access the failure analysis memory 3B and the memory under test 4 by the same address signal. Therefore, the same addresses of the failure analysis memory 3B and the memory under test 4 are accessed. As a result, when a failure is detected by the decision device 3A, by supplying, for example, a logical "1" signal indicating the failure to the failure analysis memory 3B, the logical "1" signal indicating the failure memory cell can be written in the same address of the failure analysis memory 3B as that of the memory under test 4 being accessed since the address of the failure analysis memory 3B being accessed at that time is same as the address of the memory under test 4.

A signal line 7 spanning from the pattern generator 2 to the DC test unit 3 is a signal transmission line for transmitting a control signal WCNTL for controlling the failure analysis memory 3B in a state that a writing into the failure analysis memory 3B is enabled or in a state that a writing into the failure analysis memory 3B is disabled. A signal line 8 indicates a data bus line through which the controller 1 reads out and stores therein the failure addresses stored in the failure analysis memory 3B after the completion of the test.

The operations starting from the sending operation of a control signal WCNTL to the DC test unit 3 from the pattern generator 2 to the writing operation of a generated address of a failure memory cell in the failure analysis memory 3B are defined as one cycle. When those operations are completed and the time period set in the hold time setting device 2A has passed, the pattern generator 2 proceeds to the next step.

In the next step, the pattern generator 2 updates the address of the memory under test 4 by adding one (1) to the address signal to be supplied to the memory under test 4 and updates the test pattern signal to write the updated test pattern signal in a memory cell of the updated address of the memory under test 4, and thereafter performs an operation for reading out the written test pattern signal.

In the state that the test pattern signal written in the memory under test 4 is read out, the hold mode control device controls again the pattern generator 2 in the hold mode. At the same time, the pattern generator 2 outputs a DC test start command DCS to the DC test unit 3 via the signal line 5 to activate the DC test unit 3.

By repeating the above operations, the DC tests for the memory cells of all the addresses for each terminal of the memory under test 4 are performed.

When the pattern generator 2 supplies a test pattern signal TS to each of the memory cells of all the addresses for each terminal of the memory under test 4 to perform the DC tests of all the addresses for all the terminals, the pattern end detecting device 2D detects an end of the DC tests. When the pattern end detecting device 2D detects the end of DC tests, the end signal generating device 2E outputs, in response to the detection of the end of DC tests, a pattern end signal PGEND to the controller 1.

The controller 1 detects the end of the DC tests by receiving this pattern end signal PGEND. At this time, the controller 1 reads out and stores therein the stored failure address data FLADDT from the failure analysis memory 3B and counts the number of addresses where failures occurred to determine whether or not the relieves of the failure memory cells of the memory under test are possible, or the like.

As explained above, according to the memory testing apparatus of the first embodiment of the present invention, it is sufficient for the controller 1 to supply, at the start of the DC tests, only a pattern generation command PGS to the pattern generator 2. After that, the controller 1 does not intervene at all in the control of the DC tests until the DC tests are completed. In other words, the hold mode control device 2B and the DC test start command generating device 2C provided in the pattern generator 2 directly cooperate with the decision device 3A and the failure analysis memory 3B provided in the DC test unit 3 to perform the control operations of the DC tests. Therefore, the control by the controller 1 is not necessary. As a result, there is obtained an advantage that the operation speed of the DC tests can be increased and the total time period required for the DC tests can significantly be reduced.

Figure 2:
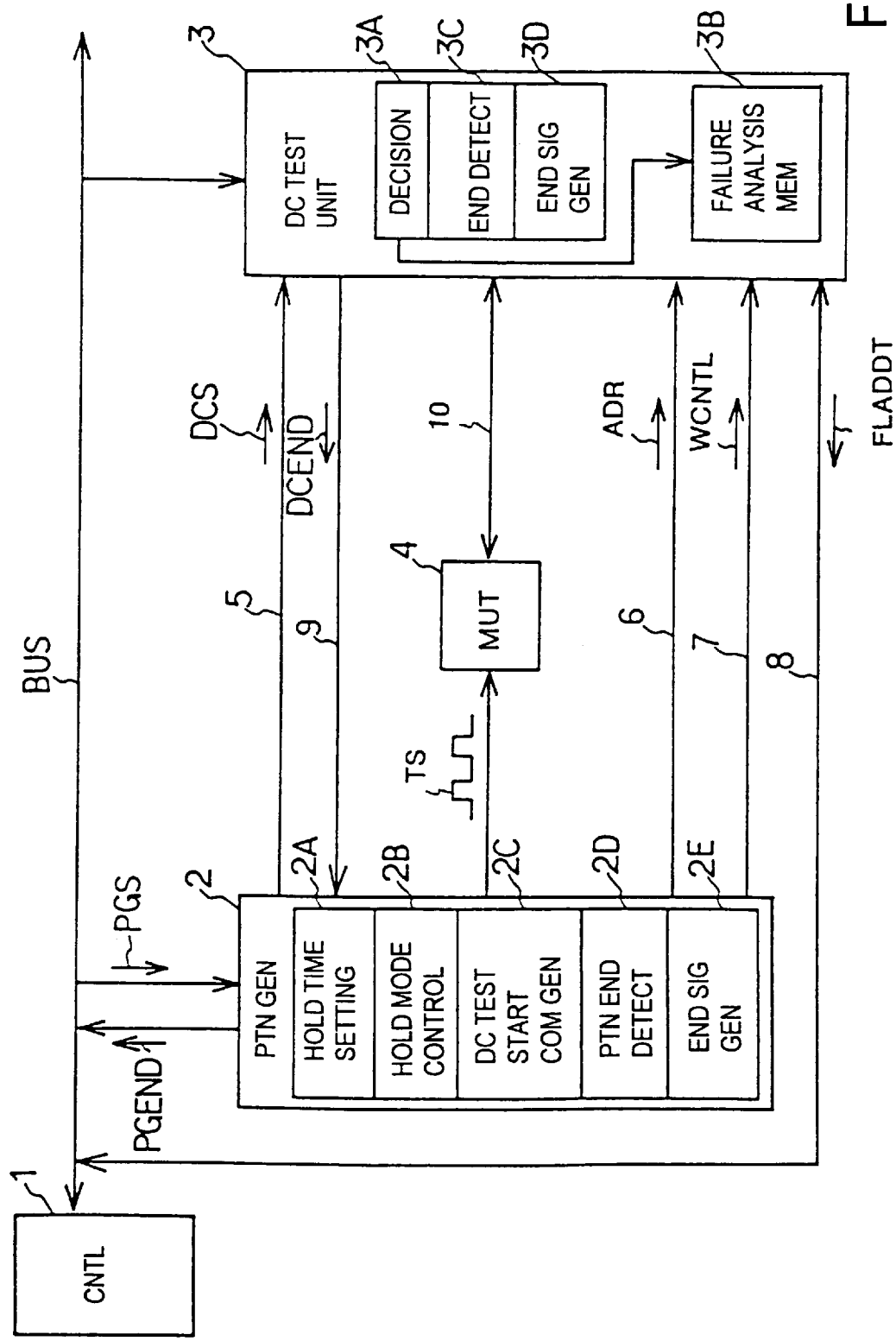
FIG. 2 is a block diagram showing the circuit configuration of a main portion of a second embodiment of the memory testing apparatus according to the present invention.

FIG. 2 is a block diagram showing the circuit configuration necessary for performing a DC test in the second embodiment of the memory testing apparatus according to the present invention. The memory testing apparatus of the second embodiment is characterized in that, in addition to the configuration of the first embodiment shown in FIG. 1, there are further provided in the DC test unit 3 an end detecting device 3C for detecting an end of a DC test for each address and an end signal generating device 3D for generating an end signal indicating the end of DC test when the end detecting device 3C detects the end of DC test, and in addition, a signal line 9 for supplying an end signal generated by the end signal generating device 3D to the pattern generator 2 is added.

According to the above configuration, when an operation for writing an address of a failure memory cell of the memory under test 4 in the failure analysis memory 3B is started in the DC test unit 3, or when the measured value is determined to be failure by the decision device 3A, the end detecting device 3C detects the end of a DC test for each address. In response to the end detection, the end signal generating device 3D outputs an end signal DCEND indicating the end of DC test over the signal line 9, and then this end signal DCEND is supplied to the pattern generator 2.

When the pattern generator 2 receives this end signal DCEND, the hold mode control device 2B resets the hold mode and proceeds to the next step. In the next step, the pattern generator 2 updates the address of the memory under test 4 to which a test pattern signal TS is supplied and updates the test pattern, and then writes the updated test pattern signal in a memory cell of the updated address. After that, an operation for reading out the written test pattern signal is performed.

When the pattern generator 2 enters a mode in which the test pattern signal TS written in the memory under test 4 is read out, the hold mode control device 2B holds the update operation of the pattern generator 2 and the pattern generator 2 enters a hold mode. At the same time, when the pattern generator 2 enters a hold mode, since the DC test start command generating device 2C outputs a DC test start command DCS, this DC test start command DCS is sent to the DC test unit 3 via the signal line 5, and then the DC test unit 3 is activated and the DC test is performed.

By repeating the above operations, the DC tests for memory cells of all the addresses for each terminal of the memory under test 4 are performed.

In such a way, according to the memory testing apparatus of the second embodiment, in addition to the decision device 3A and the failure analysis memory 3B, there are provided in the DC test unit 3 the end detecting device 3C for detecting the end of a DC test performed for each address and the end signal generating device 3D for generating an end signal in response to the detection of the end of the DC test. Therefore, it is possible to advance the control to the next step at the timing before the hold time has passed by detecting a time point when a DC test of each address is completed and by generating, based on this detection, an end signal DCEND from the end signal generating device 3D to reset the hold mode of the pattern generator 2. Consequently, since a time period of a DC test performed for each address can be reduced, there is obtained an advantage that the DC tests can be performed at a speed much higher than that of the memory testing apparatus of the above first embodiment.

Thus, according to the first and the second embodiments of the present invention, since the pattern generator 2 and the DC test unit 3 perform a direct signal transfer between them without requiring a control operation by the controller 1, a time period when the controller 1 intervenes can be eliminated, and hence a time period required for a DC test for each address can be reduced. As a result, in the case where the DC tests are performed for all the addresses for each of the terminals of the memory under test 4, there is obtained an advantage that the time period for the DC test can significantly be reduced compared with that in a conventional memory testing apparatus.

Figure 3:
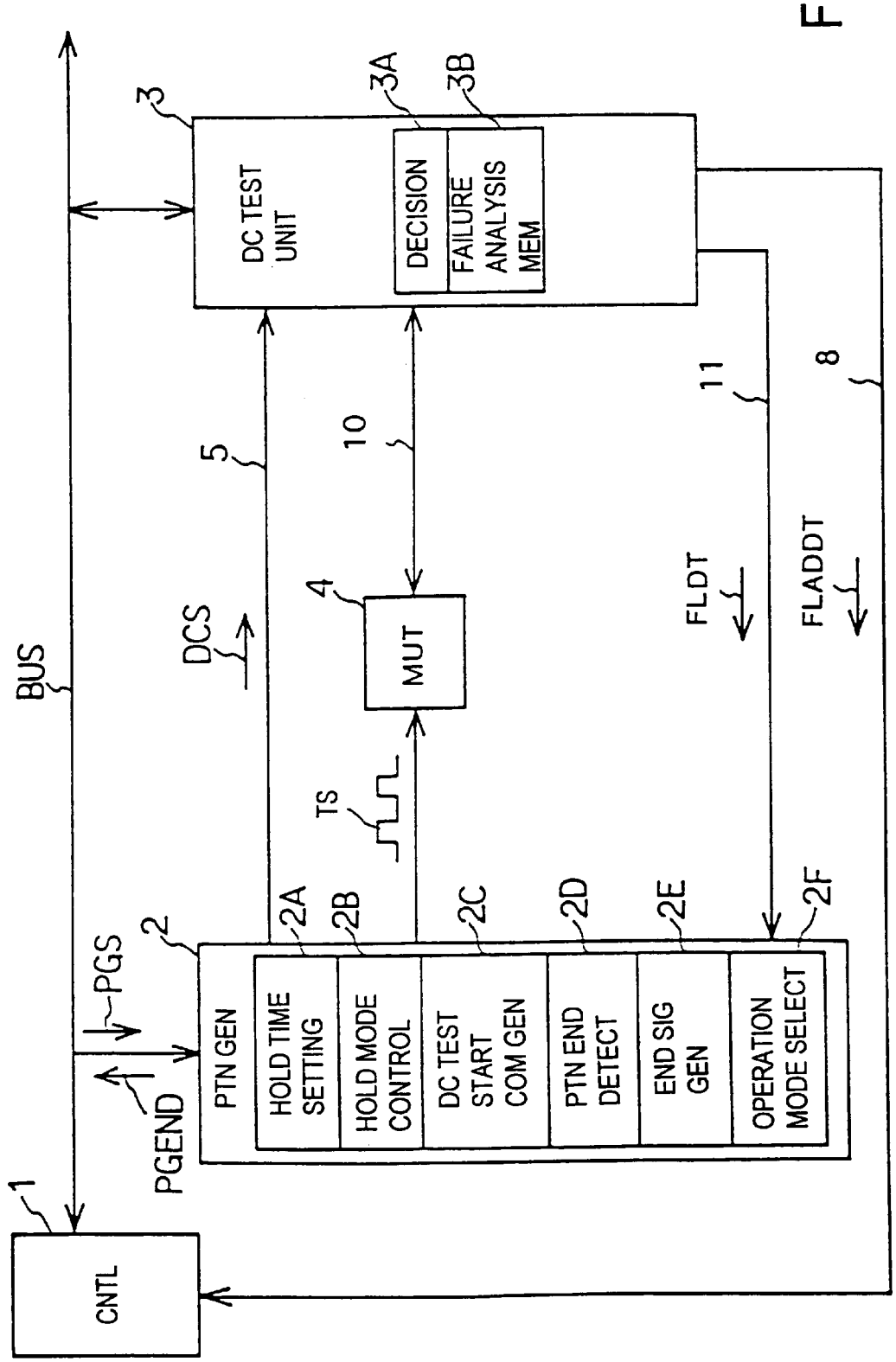
FIG. 3 is a block diagram showing the circuit configuration of a main portion of a third embodiment of the memory testing apparatus according to the present invention.

FIG. 3 is a block diagram showing the circuit configuration necessary for performing a DC test in the third embodiment of the memory testing apparatus according to the present invention. This memory testing apparatus of the third embodiment is characterized in that an operation mode selecting device 2F is further provided in the pattern generator 2 comprising, similarly to the first embodiment shown in FIG. 1, the hold time setting device 2A, the hold mode control device 2B, the DC test start command generating device 2C, the pattern end detecting device 2D, and the end signal generating device 2E, and that there is provided a signal line 11 for supplying a measured data FLDT determined to be failure from the DC test unit 3 to the pattern generator 2. Further, the DC test unit 3 comprises, similarly to the first embodiment, the decision device 3A for comparing a voltage or current taken out from the memory under test 4 with a reference value and the failure analysis memory 3B for storing therein an address of a failure memory cell of the memory under test 4.

According to the memory testing apparatus constructed as described above, it is sufficient for the controller 1 to supply only a pattern generation command PGS to the pattern generator 2 at the starting time of the DC tests. The pattern generator 2 executes, upon receiving the pattern generation command PGS, an initialization pattern generating program to generate an initialization pattern signal. This initialization pattern signal is supplied to the memory under test 4 and the memory under test 4 is initialized.

Also in this embodiment, an operation for reading a hold time to be set in the hold time setting device 2A is added to the initialization pattern generating program. The hold time to be set in the hold time setting means 2A is stored in, for example, a portion for storing a set time provided in the above program. The setting of a hold time is completed by reading the stored set time into the hold time setting device 2A when the initialization pattern generating program is executed. When a hold time is set, the hold mode control device 2B is activated and then the pattern generator 2 is controlled in a hold mode.

When the pattern generator 2 enters a hold mode, a test pattern signal TS being applied to the memory under test 4 in this hold mode is written in a memory cell of an address being accessed at that time and the test pattern signal written in the memory cell of the address is read out. At the same time, the DC test start command generating device 2C is activated and a DC test start command DCS is supplied to the DC test unit 3 via the signal line 5.

The DC test unit 3 performs, immediately upon receiving the DC test start command DCS, a DC test. In this DC test mode, the DC test unit 3 measures, as indicated by an arrow 10, a voltage or a current of one specified output terminal of the memory under test 4 which is, for example, in the reading state.

The voltage value or the current value obtained by the measurement is sent to the decision device 3A provided in the DC test unit 3, where the measured voltage value or current value is compared with a reference value. If the measured value is within the set range of the reference value, it is determined to be defectless or pass, and if the measured value is out of the set range, it is determined to be defective or failure.

When the measured value is determined to be failure, the DC test unit 3 sends the measured data (measured value) FLDT representing a failure to the pattern generator 2 via the signal line 11 to control the operation mode of the pattern generator 2 depending upon a state that a failure has occurred.

Specifically explaining, the decision device 3A sends, when the measured voltage value or current value is determined to be failure, the failure measured data FLDT to the pattern generator 2 via the signal line 11. In the pattern generator 2, the operation mode selecting device 2F controls the operation mode of the pattern generator 2 in accordance with a failure occurrence state. For example, if a voltage of a measured terminal is out of the reference range over H side, the operation mode selecting device 2F causes the operation program for the pattern generator 2 to jump to a writing operation program in that operation program. In this writing operation mode, the same test pattern signal or different test pattern signals is/are written a preset number of times in the memory cell of the address of the memory under test 4 where the failure occurred. When the number of test pattern signal writing operations reaches the preset number, a DC test start command DCS is given again to the DC test unit 3 to perform again a DC test of the address.

On the other hand, a voltage of the measured terminal is out of the reference range below L side, the operation mode selecting device 2F causes the operation program for the pattern generator 2 to jump to an erasing operation program in the operation program. In this erasing operation mode, an operation for erasing the storage content of the memory cell of the address of the memory under test 4 where the failure occurred (for example, this can be realized by an operation for writing a test pattern having all logical "0s".) is performed a preset number of times. After this erasing operation is repeated the preset number of times, a DC test start command DCS is given again to the DC test unit 3 to perform again a DC test of the address.

In this retesting, when the decision device 3A in the DC test unit 3 determines the measured value to be good (pass), the pattern generator 2 proceeds to the next step.

As a result of the retesting, if the measured value is determined to be failure again, the operation mode selecting device 2F selects again an operation mode of the pattern generator 2 to perform the above writing operation mode, or to perform the erasing operation mode to perform the retesting again, or to perform the retesting only one time and stores, if the measured value is determined to be failure in the first retesting, the address of the failure memory cell in the failure analysis memory 3B, and then proceeds to the next step.

Since the operation for storing an address of a failure memory cell is same as that in the above first embodiment, the explanation is omitted. Further, a signal line 6 for transmitting an address signal ADR from the pattern generator 2 to the DC test unit 3 and a signal line 7 for transmitting from the pattern generator 2 to the DC test unit 3 a control signal WCNTL for controlling the failure analysis memory 3B in a state in which a writing in the failure analysis memory 3B is allowed, or in a state in which a writing is not allowed are not shown.

In the next step, the pattern generator 2 updates the address of the memory under test 4 by adding, for example, one (1) to the address signal to be supplied to the memory under test 4 and updates the test pattern signal TS to write the updated test pattern in the memory cell of the updated address of the memory under test 4. After that, the pattern generator 2 performs an operation for reading out the written test pattern signal.

In the state that the test pattern signal written in the memory under test 4 is read out, the hold mode control device 2B controls the pattern generator 2 in the hold mode. At the same time, the hold mode control device 2B outputs a DC test start command DCS to the DC test unit 3 via the signal line 5 to activate the DC test unit 3.

By repeating the above operations, the DC tests are performed for the memory cells of all the addresses for each of the terminals of the memory under test 4.

When the pattern generator 2 sequentially supplies a test pattern signal TS to the memory cells of the memory under test 4 at all the addresses for each of the terminals of the memory under test 4 to complete the DC tests of all the addresses for all the terminals, the pattern end detecting device 2D detects the end of the DC tests. When the pattern end detecting device 2D detects the end of the DC tests, the end signal generating device 2E outputs, in response to the detection, a pattern end signal PGEND indicating the end of the DC tests to the controller 1.

When the controller 1 receives the pattern end signal PGEND, the controller 1 detects the end of the DC tests. At this time, the controller 1 reads out the stored failure address data FLADDT and stores them therein, and then counts the number of addresses where failures occurred to determine whether or not the failure memory cells of the memory under test can be relieved, and the like.

As explained above, according to the memory testing apparatus of the third embodiment of the present invention, it is sufficient for the controller 1 to supply, upon starting the DC tests, only a pattern generating command PGS to the pattern generator 2. After that, the controller 1 does not intervenes in the control for the DC tests until the DC tests are completed. In other words, the hold mode control device 2B, the DC test start command generating device 2C and the operation mode selecting device 2F provided in the pattern generator 2 directly cooperate with the decision device 3A and the failure analysis memory 3B provided in the DC test unit 3 to perform the control of the DC tests. Hence, the control by the controller 1 is not necessary. As a result, there is obtained an advantage that the operation speed of the DC tests can be increased and the total time period required for the DC tests can significantly be reduced.

Figure 4:
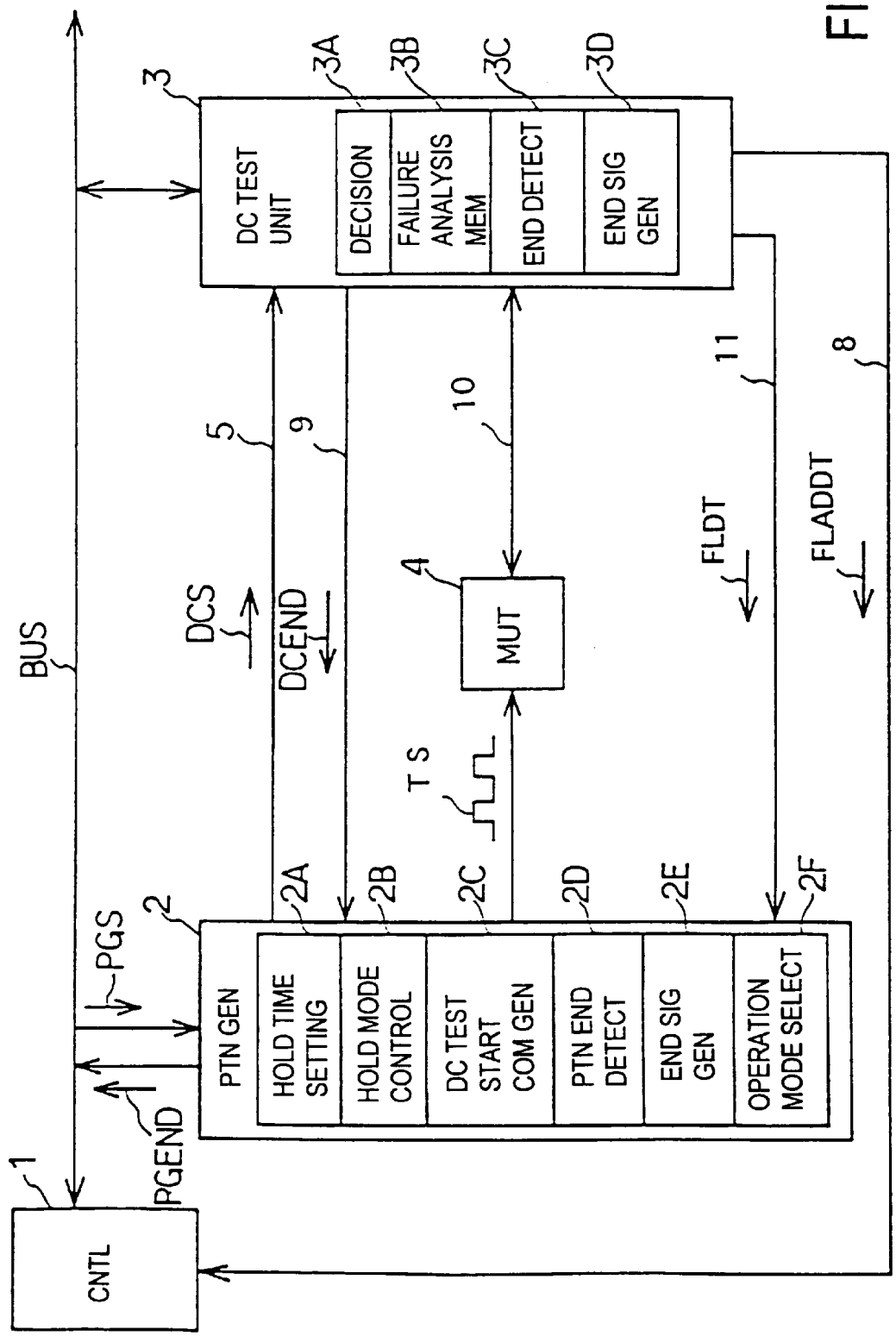
FIG. 4 is a block diagram showing the circuit configuration of a main portion of a fourth embodiment of the memory testing apparatus according to the present invention.
Figure 5:
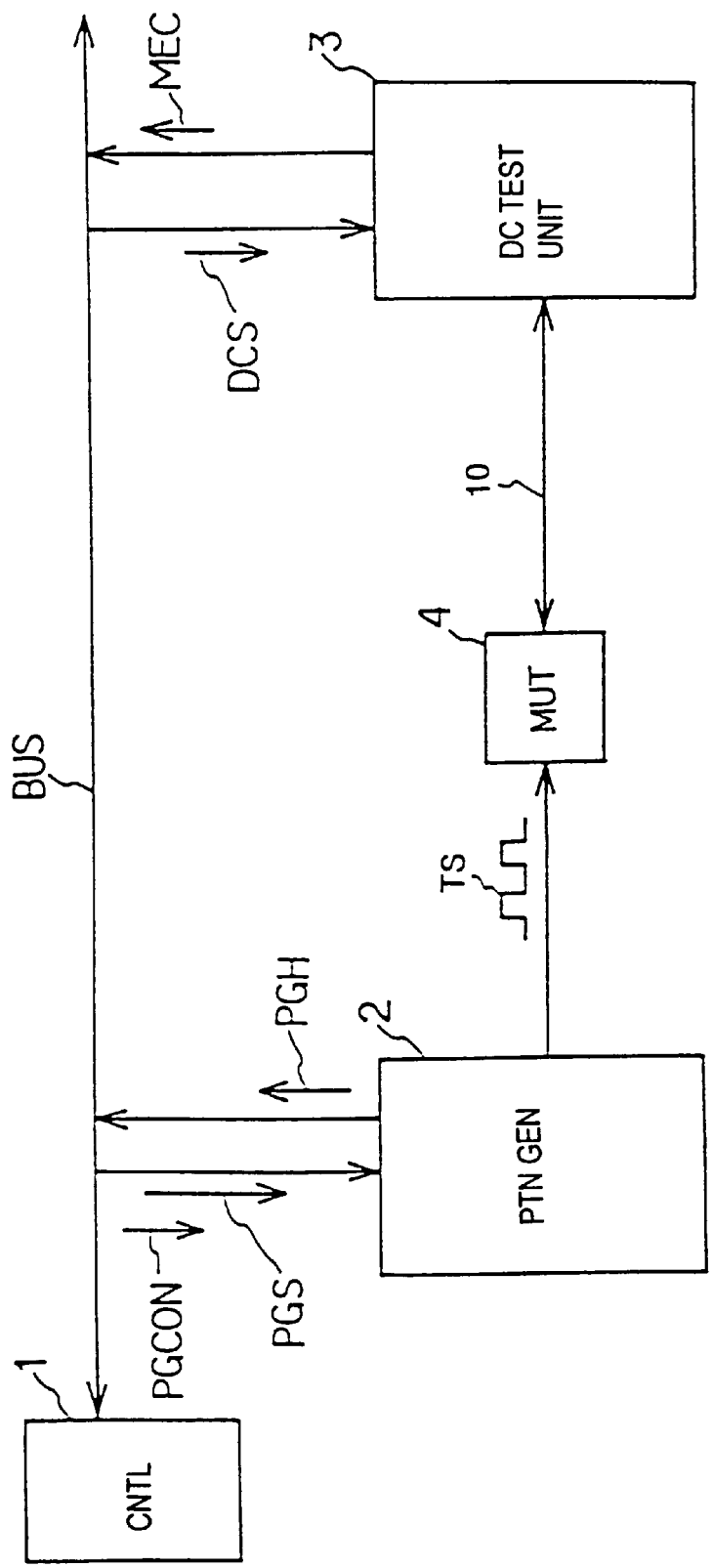
FIG. 5 is a block diagram showing an example of the circuit configuration necessary for performing a DC test provided in a conventional memory testing apparatus.

FIG. 4 is a block diagram showing the circuit configuration necessary for performing a DC test of the fourth embodiment of the memory testing apparatus according to the present invention. The memory testing apparatus of the fourth embodiment is characterized in that, in addition to the configuration of the third embodiment shown in FIG. 3, there are further provided in the DC test unit 3 an end detecting device 3C for detecting an end of a DC test for each address and an end signal generating device 3D for generating an end signal DCEND indicating the end of the DC test when the end detecting device 3C detects the end of the DC test, and in addition, a signal line 9 for supplying an end signal generated by the end signal generating device 3D to the pattern generator 2 is added.

According to the above configuration, when an operation for writing an address of a failure memory cell of the memory under test 4 in the failure analysis memory 3B is started in the DC test unit 3, or when the measured value is determined to be failure by the decision device 3A, the end detecting device 3C detects the end of a DC test for each address. In response to the end detection, the end signal generating device 3D outputs an end signal DCEND indicating the end of the DC test over the signal line 9, and then this end signal DCEND is supplied to the pattern generator 2.

When the pattern generator 2 receives this end signal DCEND, the hold mode control device 2B resets the hold mode and proceeds to the next step. In the next step, the pattern generator 2 updates the address of the memory under test 4 to which a test pattern signal TS is supplied and the test pattern, and then writes the updated test pattern signal in a memory cell of the updated address. After that, an operation for reading out the written test pattern signal is performed.

When the pattern generator 2 enters a mode in which the test pattern written in the memory under test 4 is read out, the hold mode control device 2B holds the update operation of the pattern generator 2 and the pattern generator 2 enters a hold mode. At the same time when the pattern generator 2 enters a hold mode, since the DC test start command generating device 2C outputs a DC test start command DCS, this DC test start command DCS is sent to the DC test unit 3 via the signal line 5, and then the DC test unit is activated and the DC test is performed.

By repeating the above operations the DC tests for memory cells of all the addresses for each terminal of the memory under test 4 are performed.

In such a way, according to the memory testing apparatus of the fourth embodiment, in addition to the decision device 3A and the failure analysis memory 3B, there are provided in the DC test unit 3 the end detecting device 3C for detecting the end of a DC test performed for each address and the end signal generating device 3D for generating an end signal DCEND in response to the detection of the end of the DC test. Therefore, it is possible to advance the control to the next step at the timing before the hold time has passed by detecting a time point when a DC test of each address is completed and by generating, based on this detection, an end signal DCEND from the end signal generating device 3D to reset the hold mode of the pattern generator 2. Consequently, since a time period of a DC test performed for each address can be reduced, there is obtained an advantage that the DC tests can be performed at a speed much higher than that of the memory testing apparatus of the above third embodiment.

Thus, according to the third and the fourth embodiments of the present invention, since the pattern generator 2 and the DC test unit 3 perform a direct signal transfer between them without requiring a control operation by the controller 1, a time period when the controller 1 intervenes can be eliminated, and hence a time period required for a DC test for each address can be reduced. As a result, in the case where the DC tests are performed for all the addresses for each of the terminals of the memory under test 4, there is obtained an advantage that the time period for the DC tests can significantly be reduced compared with that in a conventional memory testing apparatus.

Further, in the third and the fourth embodiments described above, there has been explained a case in which the operation mode selecting device 2F selects either one of the two operation modes, the writing operation mode and the erasing operation mode. However, it could be easily understood that the number of modes is not limited to two kinds.

As is apparent from the above discussion, according to the present invention, since the pattern generator 2 and the DC test unit 3 perform a direct signal transfer between them without requiring the control operation by the controller, the time period when the controller intervenes can be eliminated and the time period required for a DC test of each address can be reduced. As a result, when the DC tests are performed for all the addresses for each of the terminals of the memory under test, the time period of the DC tests becomes very short compared with that in the conventional memory testing apparatus. Therefore, the effect of the present invention is very large when it is practiced.

What is claimed is:

1. A memory testing apparatus including a pattern generator for supplying a test signal having a predetermined pattern to a memory under test, a direct current test unit for measuring a voltage appearing at a terminal of said memory under test or a current flowing through the terminal of said memory under test, and a controller for controlling operations of those pattern generator and the direct current test unit, said pattern generator comprising:

hold time setting means for setting a time duration of a hold mode in which said pattern generator is maintained in a state that a test signal of one pattern is kept being generated from said pattern generator;

hold mode control means for controlling said pattern generator in the hold mode; and direct current test start command generating means for supplying a direct current test start command to said direct current test unit in a state that said hold mode control means has controlled said pattern generator in the hold mode, said direct current test unit comprising:

decision means for determining whether or not a voltage value or a current value measured by said direct current test unit coincides with a reference value; and a failure analysis memory for storing therein a result of failure decision determined by said decision means representing that the measured voltage value or current value does not coincide with the reference value.

2. The memory testing apparatus according to claim 1, wherein said direct current test unit further includes:

test end detecting means for detecting an end of a direct current test performed for each of addresses of said memory under test; and direct current test end signal generating means for outputting a direct current test end signal indicating that the end of the direct current test when said test end detecting means detects the end of the direct current test performed for each address; and wherein said hold mode control means resets the hold mode of the pattern generator to enable an update of the pattern of the test signal when said pattern generator receives the direct current test end signal generated by said direct current test end signal generating means.

3. The memory testing apparatus according to claim 1 or 2, wherein said pattern generator further includes:

pattern end detecting means for detecting an end of the direct current test for said memory under test; and end signal generating means for generating a pattern end signal indicating that the end of the direct current test and for sending the pattern end signal to said controller when said pattern end detecting means detects the end of the direct current test, and wherein said controller reads out, upon receiving the pattern end signal, the stored failure decision result from said failure analysis memory.

4. The memory testing apparatus according to claim 1, wherein said decision means determines, if the voltage value or the current value measured by said direct current test unit is within a defined range, the measured value to be pass, and if the voltage value or the current value is out of the defined range, the measured value to be failure.

5. The memory testing apparatus according to claim 4, wherein said failure analysis memory stores a data indicating a failure in the same address of said failure analysis memory as that of said memory under test where the measured value determined to be failure by said decision means was generated.

6. A memory testing apparatus including a pattern generator for supplying a test signal having a predetermined pattern to a memory under test, a direct current test unit for measuring a voltage appearing at a terminal of said memory under test or a current flowing through the terminal of said memory under test, and a controller for controlling operations of those pattern generator and direct current test unit, said direct current test unit comprising:

decision means for determining whether or not a voltage value or a current value measured by said direct current test unit coincides with at least one reference value; and means for transmitting to said pattern generator a result of failure decision determined by said decision means representing that the measured voltage value or current value does not coincide with the reference value, said pattern generator comprising:

operation mode selecting means for selecting a next operation mode of the pattern generator depending upon the failure decision result transmitted from said direct current test unit thereby operating said pattern generator in the selected operation mode.

7. The memory testing apparatus according to claim 6, wherein said decision means determines whether the voltage value or the current value measured by said direct current test unit is out of a defined range over upper limit or out of the defined range below lower limit.

8. The memory testing apparatus according to claim 6, wherein said decision means compares the voltage value or the current value measured by said direct current test unit with two or more different reference values to output two or more failure decision results.

9. The memory testing apparatus according to claim 6, wherein said pattern generator further comprises:

hold time setting means for setting a time duration of a hold mode in which said pattern generator is maintained in a state that a test signal of one pattern is kept being generated from said pattern generator;

hold mode control means for controlling said pattern generator in the hold mode; and direct current test start command generating means for supplying a direct current test start command to said direct current test unit under the state that said hold mode control means has controlled said pattern generator in the hold mode.

10. The memory testing apparatus according to claim 6 or 9, wherein said direct current test unit further includes:

a failure analysis memory for storing therein a result of failure decision determined by said decision means representing that the measured voltage value or current value does not coincide with the reference value;

test end detecting means for detecting an end of a direct current test performed for each of addresses of said memory under test; and direct current test end signal generating means for outputting a direct current test end signal indicating the end of the direct current test when said test end detecting means detects the end of the direct current test performed for each address, and wherein said hold mode control means resets the hold mode of the pattern generator to enable an update of the pattern of the test signal when said pattern generator receives the direct current test end signal generated by said direct current test end signal generating means.

11. The memory testing apparatus according to claim 10, wherein said pattern generator further includes:

pattern end detecting means for detecting an end of the direct current test for said memory under test; and end signal generating means for generating a pattern end signal indicating the end of the direct current test and for sending the pattern end signal to said controller when said pattern end detecting means detects the end of the direct current test, and wherein said controller reads out, upon receiving the pattern end signal, the stored failure decision result from said failure analysis memory.

12. The memory testing apparatus according to claim 10, wherein said failure analysis memory stores a data indicating a failure in the same address of said failure analysis memory as that of said memory under test where the decision result determined to be failure by said decision means was generated.

* * * * *